United States Patent
Yagi et al.

(10) Patent No.: US 9,112,124 B2
(45) Date of Patent: Aug. 18, 2015

(54) LIGHT EMITTING DEVICE

(71) Applicant: NICHIA CORPORATION, Anan-shi (JP)

(72) Inventors: Tetsuya Yagi, Anan (JP); Yuki Miyaura, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/326,158

(22) Filed: Jul. 8, 2014

(65) Prior Publication Data

US 2015/0014710 A1 Jan. 15, 2015

(30) Foreign Application Priority Data

Jul. 10, 2013 (JP) ................................. 2013-144917
Jul. 1, 2014 (JP) ................................. 2014-135967

(51) Int. Cl.
| | |
|---|---|
| *H01L 33/52* | (2010.01) |
| *H01L 33/48* | (2010.01) |
| *H01L 33/62* | (2010.01) |
| *H01L 27/15* | (2006.01) |
| *H01L 25/075* | (2006.01) |
| *H01L 33/60* | (2010.01) |

(52) U.S. Cl.
CPC ................ *H01L 33/52* (2013.01); *H01L 27/15* (2013.01); *H01L 33/483* (2013.01); *H01L 33/62* (2013.01); *H01L 25/0753* (2013.01); *H01L 33/60* (2013.01)

(58) Field of Classification Search
CPC ......... H01L 33/54; H01L 33/56; H01L 33/52; H01L 33/483; F21V 15/00
USPC ............. 257/98, 99, 100, 685, 690, 730, 790, 257/E33.056, E33.058, E33.059
See application file for complete search history.

(56) References Cited

U.S. PATENT DOCUMENTS

| | | | |
|---|---|---|---|
| 2011/0241028 A1 | 10/2011 | Park et al. | |
| 2011/0255281 A1* | 10/2011 | Takei et al. | .................. 362/235 |
| 2012/0032197 A1* | 2/2012 | Kurimoto | ........................ 257/88 |

FOREIGN PATENT DOCUMENTS

| | | |
|---|---|---|
| JP | 2006-130714 A | 5/2006 |
| JP | 2009-026846 A | 2/2009 |

(Continued)

OTHER PUBLICATIONS

Extended European Search Report dated Dec. 2, 2014 issued in Application No. 14176143.7.

*Primary Examiner* — Tucker Wright
(74) *Attorney, Agent, or Firm* — Foley & Lardner LLP

(57) ABSTRACT

With a light emitting device of a package formed by two types of molded resins, entry of water from between the molded resins may cause the light emitting device to be incapable of turning on. A light emitting device of the present invention includes: a package that has an opening at an upper surface thereof; a first molded resin that forms a part of the upper surface of the package; a second molded resin that forms an inner wall surface of the opening of the package; a lead frame that is buried in the package so as to be partially exposed at a bottom surface of the opening of the package, the lead frame having an end portion externally projected outside from a side surface of the package; and a light emitting element that is connected to an upper surface of the lead frame being exposed at the bottom surface of the opening. The second molded resin is higher than the first molded resin in light reflectance to light emitted from the light emitting element. The upper surface of the lead frame buried in the package is disposed so as to be spaced apart from the interface between the first molded resin and the second molded resin.

19 Claims, 5 Drawing Sheets

(56) References Cited

FOREIGN PATENT DOCUMENTS

| | | |
|---|---|---|
| JP | 2010-153666 A | 7/2010 |
| JP | 2010-206039 A | 9/2010 |
| JP | 2012-054533 A | 3/2012 |
| WO | WO-2010/073950 A1 | 7/2010 |

* cited by examiner

LIGHT EMITTING DEVICE

CROSS-REFERENCE TO RELATED APPLICATION

This application claims priority to Japanese Patent Application No. 2013-144917, filed on Jul. 10, 2013 and Japanese Patent Application No. 2014-135967, filed on Jul. 1, 2014, the disclosures of which are hereby incorporated by reference in their entirety.

BACKGROUND OF THE INVENTION

1. Field of the Invention

The present invention relates to a light emitting device using LEDs. In particular, the present invention relates to a light emitting device used for a display device such as an outdoor display.

2. Description of Related Art

In recent years, display devices using light emitting diodes (hereinafter also referred to as the LEDs) of three primary colors of red (R), green (G), and blue (B) are coming into actual use. In such a display device, for example, light emitting devices each including a package are arranged in matrix. In the opening of the package, LEDs respectively emitting light beams of three primary colors are stored. By combinations of emission colors of the LEDs, full-color images are displayed.

Some of the light emitting devices to be used for such a display device have an upper surface of the package painted black, for the purpose of improving the contrast ratio between turn-on and turn-off of the LEDs. Such light emitting devices involve problems such as peeling or color-fading of the paint, which invites a reduction in the contrast.

In order to solve this problem, there is provided a package in which black molded resin exhibiting an excellent light absorption ratio is employed for the outer side surfaces, and white molded resin with high reflectance is employed for the opening of the package (JP 2006-130714 A).

However, with the light emitting device disclosed in JP 2006-130714 A, when the white resin and black resin peel from each other, water may possibly enter the package to reach the lead frame located therein. This may invite trouble.

SUMMARY OF THE INVENTION

Accordingly, in order to solve the problem noted above, a light emitting device according to the present invention includes: a package that has an opening at an upper surface thereof; a lead frame that is buried in the package so as to be partially exposed at a bottom surface of the opening of the package, the lead frame having an end portion externally projected outside from a side surface of the package; and a light emitting element that is connected to an upper surface of the lead frame being exposed at the bottom surface of the opening. The package includes a first molded resin that has a first upper surface that forms a part of the upper surface, and a second molded resin that has an inner wall surface of the opening of the package and a second upper surface that forms a part of the upper surface and surround the opening at an inner side with respect to the first upper surface. Further, the second molded resin is higher than the first molded resin in light reflectance to light emitted from the light emitting element. The upper surface of the lead frame buried in the package is disposed so as to be spaced apart from an interface between the first molded resin and the second molded resin.

As described above, the upper surface of the lead frame that is connected to the light emitting element and the interface between separate molded resins are disposed so as to be spaced apart from each other. Accordingly, even if water or the like enters from between the separate molded resins, such water will not enter the light emitting element mounted area inside the package. Thus, a highly reliable light emitting device can be provided.

BRIEF DESCRIPTION OF THE DRAWINGS

FIGS. 7A and 7B are schematic diagrams showing an exemplary outdoor display using light emitting devices according to one example of the present invention, in which FIG. 7A shows the outdoor display and FIG. 7B shows image displaying units structuring the display and light emitting devices structuring the image displaying units.

DETAILED DESCRIPTION OF EMBODIMENTS

Figure 1:
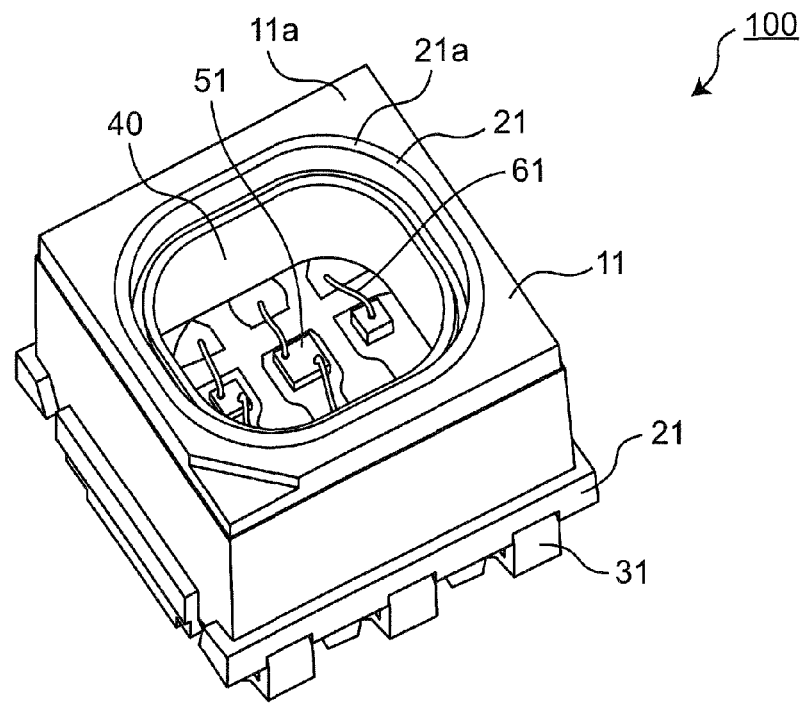
FIG. 1 is a schematic perspective view for describing a light emitting device according to one example of the present invention.
Figure 2:
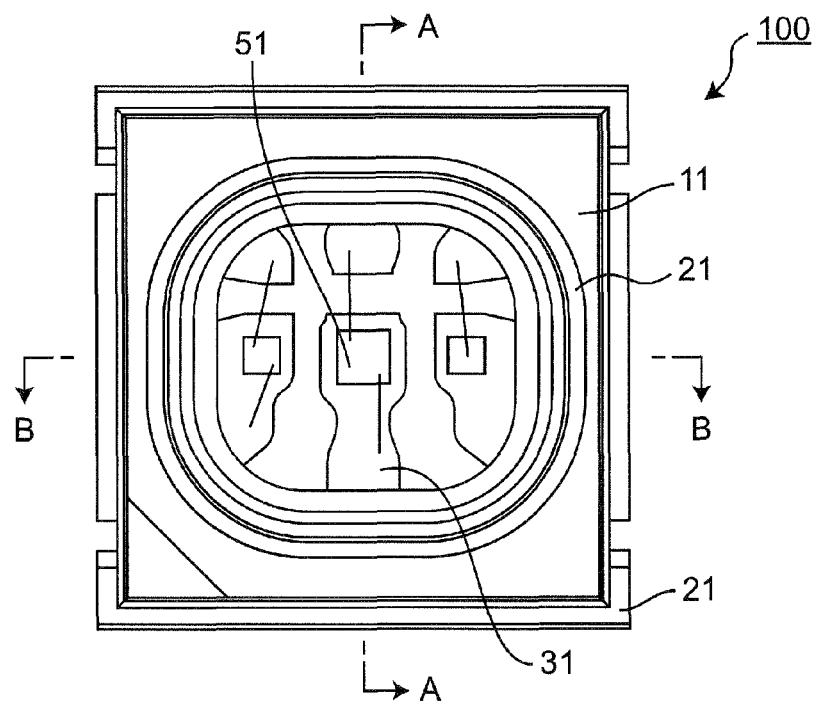
FIG. 2 is a schematic plan view for describing a light emitting device according to one example of the present invention.

Hereinafter, embodiments of the present invention will be described with reference to the drawings.

A light emitting device 100 according to an embodiment of the present invention includes, for example as shown in FIGS. 1 to 4, a package having an opening at an upper surface side thereof, lead frames 31 partially buried in the package, and light emitting elements 51 respectively connected to the upper surfaces of the lead frames. The package has an opening 40 at the center of the upper surface side thereof. The upper side that surrounds the opening 40 is formed by a surface (first upper surface 11a) of a first molded resin 11 and a surface (second upper surface 21a) of a second molded resin 21 that is at an inner side with respect to the first upper surface 11a and surrounds the opening 40. The inner wall surface and bottom surface of the opening 40 are formed by the surfaces of the second molded resin 21. The lead frames 31 are buried in the package so as to be partially exposed at the bottom surface of the opening of the package, while the end portions of the lead frames 31 are externally projected outside from the side surfaces of the package. Further, the light emitting elements 51 are connected to the upper surfaces of the lead frames 31. The upper surface of each lead frame 31 and the interface between the first molded resin 11 and the second molded resin 21 are disposed so as to be spaced apart from each other.

In this manner, since the upper surfaces of the lead frames connected to the light emitting elements and the interface between separate molded resins are disposed so as to be spaced apart from each other, even if the separate molded resins are peeled from each other, water or the like will not enter the light emitting element mounted area inside the package. Thus, a highly reliable light emitting device can be provided.

In the following, the constituents will be described in detail.

<Package>

Package includes the second molded resin 21 formed with the opening 40 and the first molded resin 11 formed to cover the second molded resin 21. In the embodiment, the first molded resin 11 is not needed to cover all surfaces of the second molded resin 21 and the second molded rein 21 may be exposed at a part of an outer surface of the package. In the package that is formed as described above, the inner wall surface of the opening 40 and the second upper surface 21a around the opening 40 are formed by the surfaces of the second molded resin 21, and the first upper surface 11a at outer side of the second upper surface 21a is formed by the surface of the first molded resin 11.

The size and shape of the package are not particularly limited, and can be adjusted as appropriate in accordance with the size of the employed light emitting elements, the number of mounted light emitting elements, and the like. For example, the outer shape of the planar shape (hereinafter simply referred to as the "planar shape") as seen from the upper surface, which is the light emission observing surface, may be a circle, an ellipse, a triangle, a quadrangle, a polygon, or the like, or variations thereof (for example, a shape with rounded corners or chamfered corners). Further, at least one surface may be tapered for the purpose of improving releasability from a mold assembly that is used in the manufacturing process of the package. Further, the upper surface of the package may be provided with minor unevenness for the purpose of scattering the light from the outside of the light emitting device to thereby improve the contrast.

For example, in the case where the light emitting devices are used for image displaying units, which are used for an outdoor display, the terminals (the lead frames) of the light emitting devices are usually coated by waterproofing resin. Accordingly, the planar shape of the package is preferably a circle or a rounded quadrangle. By employing such a shape, excellent flowability is exhibited when the terminals (the lead frames) are coated by waterproofing resin. This is particularly effective for a high-definition display in which the distance between the light emitting devices is short. Further, since concentration of stress to the corners of the package will not occur, peeling or cracks of the waterproofing resin can be reduced.

The lead frames, which will be described below, are buried in the package for electrically connecting the light emitting elements and any external element to each other. The package can be manufactured by using any known method, such as an injection molding method, for example, disclosed in JP 2006-130714 A.

The opening 40 is provided at the upper surface side of the package. The opening 40 is mainly formed by a bottom surface and an inner wall surface that is continuous from the bottom surface to the upper surface of the package. At the bottom surface, the lead frames 31 are partially exposed outside the package. To the exposed upper surface of each lead frame 31, the light emitting element 51 is connected.

The shape of the opening can be changed in various manners taking into consideration the arrangement of the light emitting elements, the required optical characteristic, and the like. For example, the planar shape may be a circle, an ellipse, a square, a rectangle, a polygon, or the like, or variations thereof (for example, a shape with rounded corners or chamfered corners). As to the slope of the inner wall surface, it may be vertical from the bottom surface. Alternatively, for the purpose of adjusting releasability or light distribution of the package, the inner wall surface may be tapered, i.e., the inner wall surface may be widened from the bottom surface toward the light emission observing surface side.

In the opening, the inner wall surface is formed by the second molded resin 21. The second molded resin is higher than the first molded resin in light reflectance to light emitted from the light emitting elements. Accordingly, by forming the inner wall surface of the opening by the second molded resin, the light emitted from the light emitting elements can be extracted highly efficiently, and the brightness of the light emitting device can be increased. Here, a part of the opening may be formed by the first molded resin. However, in order to further enhance the brightness of the light emitting device, preferably the first molded resin is not provided in the opening such that absorption of emitted light in the opening is prevented. It is preferable that the second molded resin is continuous from the inner wall surface to the upper surface of the package. Further, it is more preferable that the second molded resin is provided to the portion surrounding the opening at the upper surface of the package. The inner wall surface or the bottom surface of the opening may be provided with a step difference, a groove, minor unevenness, or the like, for the purpose of preventing the second molded resin from peeling from the sealing resin and the like.

The package of the light emitting device according to the embodiment of the present invention includes, as shown in FIGS. 1 to 4, the first molded resin 11 and the second molded resin 21. The material of the molded resin may be, for example, polyimide (PI), polyamide (PA), polyphthalamide (PPA), polycarbonate resin, polyphenylene sulfide (PPS), liquid crystal polymer (LCP), ABS resin, epoxy resin, phenolic resin, acrylic resin, PBT resin, and resin of various types used as a package material in the present technical field.

In order to improve the contrast of the light emitting device, the first molded resin 11 is provided to at least a part of the upper surface of the package, preferably to surround the second upper surface 21a. Accordingly, the first molded resin 11 preferably exhibits low light reflectance to the light from the outside of the light emitting device (mostly sunlight). Preferably, the first molded resin 11 is usually black or any color similar to black. For example, the first molded resin 11 may be made of PPA resin in which carbon black is blended.

Since the second molded resin 21 is provided to the inner wall surface of the opening 40, it is preferably made of a material that exhibits high light reflectance to the light emitted from the light emitting elements 51. For example, the second molded resin 21 may be made of PPA resin in which powder of a substantially white inorganic substance, such as $TiO_2$ or ZnO, is blended.

The first molded resin and the second molded resin may be made of resins of different types. However, in order to enhance adhesion between the first molded resin and the second molded resin, it is preferable that the first molded resin and the second molded resin are made of resin of an identical type.

In the package, the lead frames, which will be described below, are buried. Further, the lead frames are partially exposed at the bottom surface of the opening of the package. To the upper surfaces of the lead frames exposed at the bottom surface, the light emitting elements are connected. Accordingly, if the lead frames and the interface between the first molded resin and the second molded resin are in contact with each other, water entered from between the first and second molded resins may reach the upper surfaces of the lead frames buried in the package. Adhesion between the molded resin and the lead frames is not as strong as adhesion between resin components. Accordingly, if water reaches the upper surfaces of the lead frames, the water may enter from the boundary between the package and the lead frames to reach the light emitting elements in the opening. This may make the light emitting elements impossible to turn on.

However, in the light emitting device according to the embodiment of the present invention, the upper surfaces of the lead frames that are buried in the package and the interface between the first molded resin 11 and the second molded resin 21 are disposed so as to be spaced apart from each other. Thus, even if the first molded resin 11 and the second molded resin 21 are peeled from each other, entry of water into the opening can be suppressed.

Figure 3:
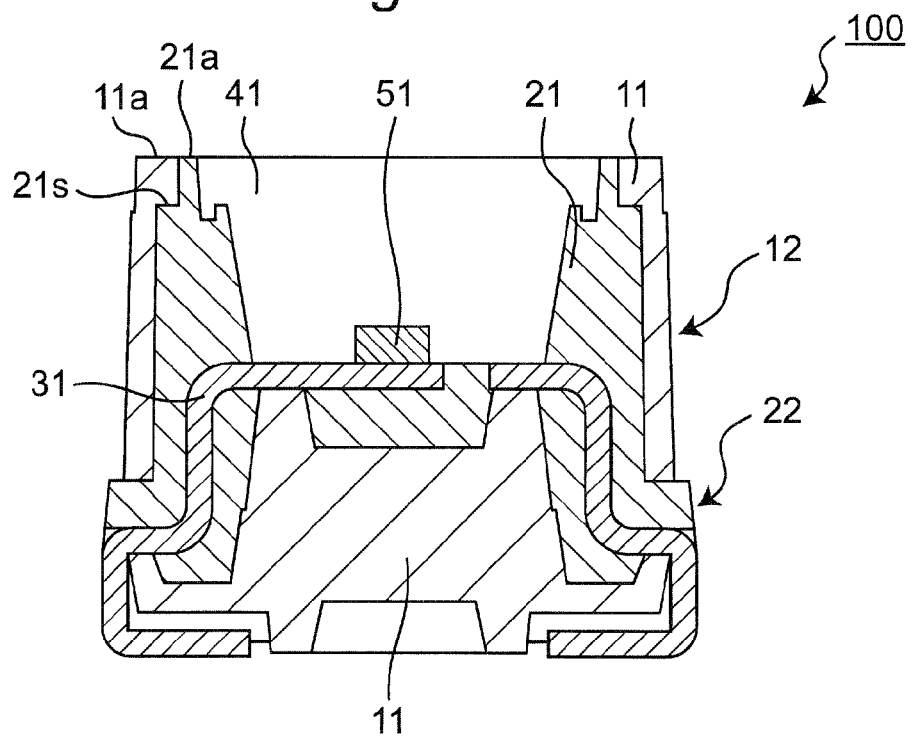
FIG. 3 is a schematic cross-sectional view taken along line A-A of the light emitting device shown in FIG. 2.
Figure 4:
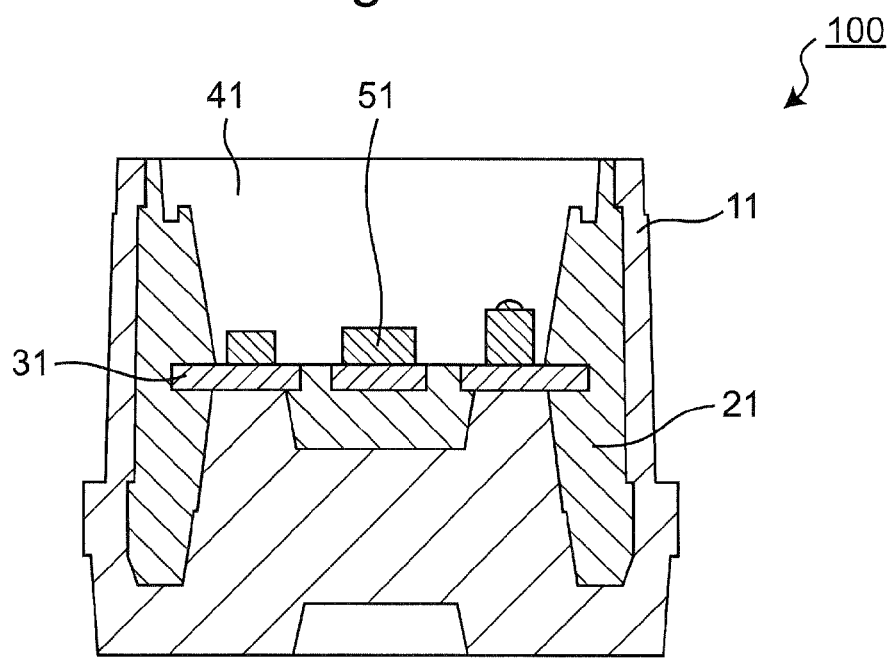
FIG. 4 is a schematic cross-sectional view taken along line B-B of the light emitting device shown in FIG. 2.

The light emitting device according to the embodiment of the present invention preferably includes, at each of the side surfaces where the lead frames project, a first side surface 12 formed by the first molded resin and a second side surface 22 formed by the second molded resin. Further, preferably, the second side surface 22 is disposed below the first side surface 12, and above at least externally projected lead frames 31. Thus, even if the first molded resin and the second molded resin peel from each other at the upper surface of the package and entry of water occurs, such water can be discharged to the outside of the package from between the first side surface 12 and the second side surface 22. Accordingly, water will not reach the upper surfaces of the lead frames, and hence a highly reliable light emitting device can be provided. It is more preferable that the second side surface 22 projects further than the first side surface 12. Thus, when water is discharged to the outside of the package from between the first side surface 12 and the second side surface 22, it becomes possible to suppress the discharged water from reaching the external terminals (the lead frames). Further, the interface between the first molded resin 11 and the second molded resin 21 is preferably bent at a position higher than the bottom surface of the opening. For example, as shown in FIG. 3, a step portion 21s that is substantially in parallel to the second upper surface 21a is formed on the outer peripheral surface of the second molded resin 21 so that the angle of the outer peripheral surface of the second molded resin 21 is changed discontinuously to bend the interface between the first molded resin 11 and the second molded resin 21. With this arrangement, even in the case where peeling of the interface between the first and second molded resin occurs, progression of the peeling can be suppressed by the step portion 21s, and thus water can be prevented from entering the portions below the step portion 21s. Thus, a light emitting device having high reliability can be obtained. In the present embodiment, the step portion 21s is formed substantially in parallel to the second upper surface 21a, but the step portion 21s is to reduce progress of peeling of the interface between the first and second molded resin, so that the step portion 21s may be arranged in a direction at least intersects the direction perpendicular to the second upper surface 21a. That is, in the present embodiment, the interface between the first molded resin 11 and the second molded resin 21 has an inclination that is changed discontinuously, which allows for suppression of propagation of peeling of the interface between the first and second molded resins. Also, the portion where the inclination is changed discontinuously is not needed to be formed along the entire outer periphery of the interface between the first molded resin 11 and the second molded resin 21, but preferably, the portion where the inclination is changed discontinuously along the entire outer periphery of the second molded resin 21 (for example, the step portion 21s in FIG. 3) the interface between the first molded resin 11 and the second molded resin 21 (for example, the step portion 21s in FIG. 3 may be formed.

Further, the second side surface disposed above the lead frames may be also disposed below the lead frames, at each of the side surfaces where the lead frames project. Still further, the lead frames may be disposed so as to be fully spaced apart from the first molded resin. Thus, entry of water or the like into the package can be further suppressed, and hence a further highly reliable light emitting device can be provided.

The light emitting device according to one embodiment of the present invention can be used for image displaying units of an outdoor display or the like. It is preferable that the image displaying units are structured such that waterproofing resin covers the second side surface 22 of each light emitting device and the lead frames projecting from the side surfaces, as well as a part of the first side surface 12. Allowing the second side surface that is formed by the second molded resin and that is disposed at the side surface to be covered by the waterproofing resin, the waterproofness of the light emitting device can be enhanced without a reduction in contrast. Further, it is more preferable that the second side surface 22 projects further than the first side surface 12. Thus, entry of water such as rainwater into the light emitting device can be more effectively prevented, and adhesion to the waterproofing resin can be enhanced when the light emitting device is used for the image displaying units.

<Light Emitting Element>

Each light emitting element is usually a semiconductor light emitting element of any type, as long as it is a so-called light emitting diode element. At least one light emitting element is mounted.

In the light emitting device according to the embodiment of the present invention, one or more light emitting elements are mounted. Note that, a plurality of light emitting elements that respectively emit different colors may be mounted. In particular, when the light emitting elements respectively emitting blue-, green-, red-base colors are employed in combination in the light emitting device used for a full-color display device, color reproducibility can be improved.

The light emitting elements of any wavelength can be selected in accordance with the intended use. For example, as to the light emitting element of blue (the light having a wavelength of 430 nm to 490 nm) and green color (the light having a wavelength of 490 nm to 570 nm), the light emitting element using a semiconductor layer of ZnSe, a nitride semiconductor ($In_XAl_YGa_{1-X-Y}N$, $0 \leq X$, $0 \leq Y$, $X+Y<1$), GaP, or the like may be employed. As to the light emitting element of red (the light having a wavelength of 620 nm to 750 nm), the light emitting element using a semiconductor layer of GaAlAs, AlInGaP, or the like may be employed.

The light emitting element is usually formed by having a semiconductor layer deposited on a deposition-target substrate (for example, a sapphire substrate). The substrate may have unevenness at the joining surface relative to the semiconductor layer. Thus, the critical angle that is formed when the light emitted from the semiconductor layer hits the substrate can be intentionally changed, to thereby extract the light to the outside of the substrate with ease. The semiconductor element may have a pair of positive and negative electrodes on the same surface side relative to the active layer, or it may have the positive and negative electrodes on the different sides relative to the active layer.

The light emitting elements are mounted on the lead frames, which will be described below. For the purpose of mounting, a bonding material is used. For example, in the case of the light emitting element that is formed by depositing a nitride semiconductor on the sapphire substrate and that emits blue and green light, epoxy resin, silicone, or the like can be used. Further, taking into consideration deterioration due to light or heat from the light emitting element, the back surface of the light emitting element may be Al-plated. Alternatively, without the use of a resin, a solder such as a eutectic Au—Sn solder, a brazing material such as a low-melting metal or the like may be used. Further, in the case of the light emitting element having electrodes on both surfaces, such as the light emitting element that is made of GaAs and the like and that emits red light, the light emitting element may be die bonded by a conductive paste of silver, gold, palladium, or the like.

The light emitting device according to the present invention may include a protective element in addition to the light emitting elements. One protective element may be provided, or a plurality of two or more protective elements may be provided. Here, the protection element is not particularly limited, and may be any known protective element that can be mounted on the light emitting device. Specifically, the protective element may be a protective circuit against overheat, overvoltage, and overcurrent, an electrostatic discharge protection element, or the like. The mounting site may be inside the opening and near the light emitting elements. Alternatively, it may be partially or entirely buried in the resin package.

<Lead Frame>

The lead frames are partially buried in the package of the light emitting device according to the embodiment of the present invention. Each lead frame is a member for mounting the light emitting element. Further, the lead frame also functions as an electrode electrically connected to the light emitting element, and as a lead terminal. Therefore, the lead frame is buried in the package so as to be partially exposed at the bottom surface of the opening, while the end portions of the lead frame externally project outside from the side surfaces of the package. Since a part of the surface of the lead frame is exposed at the bottom surface of the opening, the light from the light emitting element can be reflected, and can be efficiently extracted in the front direction.

The lead frame may be provided with a penetrating hole in the thickness direction at the portion exposed at the bottom surface of the opening. The bottom surface of the package is exposed at the penetrating hole. Accordingly, formation of the penetrating hole at the lead frame provides a reduction in the contact area between sealing resin and the lead frame when the sealing resin is packed into the opening, and an increase in the contact area between the sealing resin and the package. Since adhesion between the sealing resin and the package molded resin is greater than adhesion between the lead frame and the sealing resin, fixing force between the package and the sealing resin can be increased.

Further, the portion of the lead frame that is buried in the package may be provided with a penetrating hole in the thickness direction or may be partially cut off. This provides an increase in the contact area between the package and the lead frame, and the fixing force between the package and the lead frame can be increased.

Two or more lead frames are usually provided in one light emitting device. Further, the number of the lead frame may be greater than the number of the light emitting elements by one or more, or may be at least twice as the number of the light emitting elements. For example, in the case where the three light emitting elements are mounted, one light emitting element is placed on one lead frame. These light emitting elements are respectively electrically connected to the lead frames which are different from the lead frames on which these light emitting elements are respectively placed. The plurality of lead frames are disposed in the package as being substantially electrically disconnected other than the above-described electrical connection to the electrodes of the light emitting elements. In such a case where a plurality of light emitting elements are mounted, by placing one light emitting element on one lead frame, the heat generated by the light emitting elements can be more efficiently dissipated to outside by the lead frames.

Each lead frame is only required to be substantially plate-like, and it may be wavy plate-like, or uneven plate-like. The material of the lead frame is not particularly limited, as long as it can supply appropriate power to the light emitting element. Further, the lead frame is preferably made of a material with relatively great thermal conductivity. By the lead frame being made of such a material, the heat generated at the light emitting element can be efficiently released. For example, preferable materials include a material with thermal conductivity of about 200 W/(m·K) or more, a material with relatively great mechanical strength, and a material that can be easily subjected to press punching, etching, or the like. Specifically, the material may be a metal such as copper, aluminum, gold, silver, tungsten, iron, or nickel, or an alloy such as iron-nickel alloy and phosphor bronze. Further, it is preferable that the surface of the lead frame is provided with reflective plating (for example, silver or silver alloy, Ni/Pd/Au or the like) in order to efficiently extract light from the mounted light emitting element. The size, thickness, shape, and the like of the lead frame can be adjusted as appropriate taking into consideration the size and shape of the light emitting device desired to be obtained.

The shape or size of the portion of the lead frame located outside the package (that is, the lead terminal) can be adjusted as appropriate, taking into consideration the heat emitting performance of the light emitting element mounted on the light emitting device and the usage mode of the light emitting device (the disposition space, the disposition position, and the like). Further, the lead terminal can be bent or altered in shape as appropriate in accordance with the usage mode, such as the positional relationship relative to other electronic equipment.

Further, each lead frame is preferably bent at the portion buried in the package. This enhances adhesion between the package and the lead frame. Accordingly, peeling of the components from each other and entry of water or the like caused thereby can be effectively prevented, and the depth of the opening can be reduced. Thus, a light emitting device with high light extraction efficiency is provided.

In the light emitting device 100 according to the embodiment of the present invention, use of a mold assembly having a retaining pin for fixing the position of each lead frame as the mold assembly for molding the second molded resin by injection molding can prevent misalignment of the lead frame exposed at the bottom surface of the opening. The retaining pin is provided at the upper mold, and fixes the lead frame by retaining the lower surface side of the lead frame exposed at the bottom surface of the opening of the package. The second molded resin is not formed at the portion having been in contact with the retaining pin during formation of the second molded resin, and the first molded resin is disposed when the first molded resin is formed. Accordingly, when the mold assembly having the retaining pin is used, the first molded resin and the lower surface of the lead frame are disposed in contact with each other. However, since the upper surface of the lead frame is disposed spaced apart from the interface between the first molded resin and the second molded resin, entry of water inside the opening can be prevented. Further, since the lead frame is bent at the portion buried in the package, entry of water or the like can be more effectively suppressed. Further, as misalignment of the lead frame exposed at the bottom surface of the opening is prevented, the positional precision of the die can also be improved. That is, it becomes possible to stabilize light distribution of the light emitting device, and to improve mass-productivity.

<Sealing Resin>

In the light emitting device according to the embodiment of the present invention, sealing resin is packed inside the opening of the package. The sealing resin is a material that seals the light emitting elements, the conductive wires, and a part of the lead frames to thereby provide protection against dust, water, external force, and the like. The base material of the sealing resin is preferably a material through which light emitted from the light emitting elements can be transmitted (preferably, a transmittance of 70% or more).

Specifically, the material of the sealing resin may be an addition-type or a condensation-type silicone resin, an epoxy resin, a phenolic resin, a polycarbonate resin, an acrylic resin, an ABS resin, a polybutylene terephthalateresin, a polyphthalamide resin, a polyphenylene sulfide resin, a liquid crystal polymer, or a hybrid resin containing at least one or more types of the foregoing resins. Preferably, the material is silicone resin or epoxy resin. In the case where the light emitting device according to the embodiments of the present invention is used for image displaying units of an outdoor display, particularly, an epoxy resin which has good waterproofness is preferably used.

The sealing resin may contain a dispersing agent or a phosphor substance. The dispersing agent diffuses light, and hence is capable of relaxing directivity of the light emitted from the light emitting elements and to widen the viewing angle. The phosphor substance converts light from the light emitting elements, and is capable of converting the wavelength of the light emitted from the light emitting elements to the outside of the package. In the case where the light from the light emitting elements is visible light of short wavelength with great energy, a variety of materials such as a perylene derivative being an organic phosphor, an inorganic phosphor such as ZnCdS:Cu, YAG:Ce, a nitrogen-containing CaO—$Al_2O_3$—$SiO_2$ activated by Eu and/or Cr, and the like can be suitably used. Two or more types of sealing resins can be used as necessary.

<Wire>

In the light emitting device according to the embodiment of the present invention, a pair of electrodes formed at each light emitting element is electrically connected to the lead frame and/or the electrode of an adjacent light emitting element by wires for supplying power to the light emitting element. The material, diameter, and the like of each wire are not particularly limited, and any wire that is usually used in the present technical field can be used. In particular, a wire capable of forming good ohmic contact with the electrode of a light emitting element, capable of establishing good mechanical connection, and having good electrical conductivity and thermal conductivity is preferably used.

For example, a wire made of a metal such as gold, copper, platinum, aluminum, silver, and an alloy of the foregoing metals, a wire whose surface is coated by silver or silver alloy, and the like can be used. Among those, as the material having high reflectance, silver, copper, lead, aluminum, platinum, and alloy of the foregoing metals are preferable, and silver or silver alloy is more preferable.

The diameter of the wire is not particularly limited, and it may be about 10 µm to about 70 µm, preferably about 15 µm to about 50 µm, and more preferably about 18 µm to about 30 µm (for example, about 25 µm). The thermal conductivity of the wire is preferably about 0.01 cal/S·cm$^{2\cdot\circ}$ C./cm or more, and more preferably about 0.5 cal/S·cm$^{2\cdot\circ}$ C./cm or more.

<Image Displaying Unit>

Figure 7A:
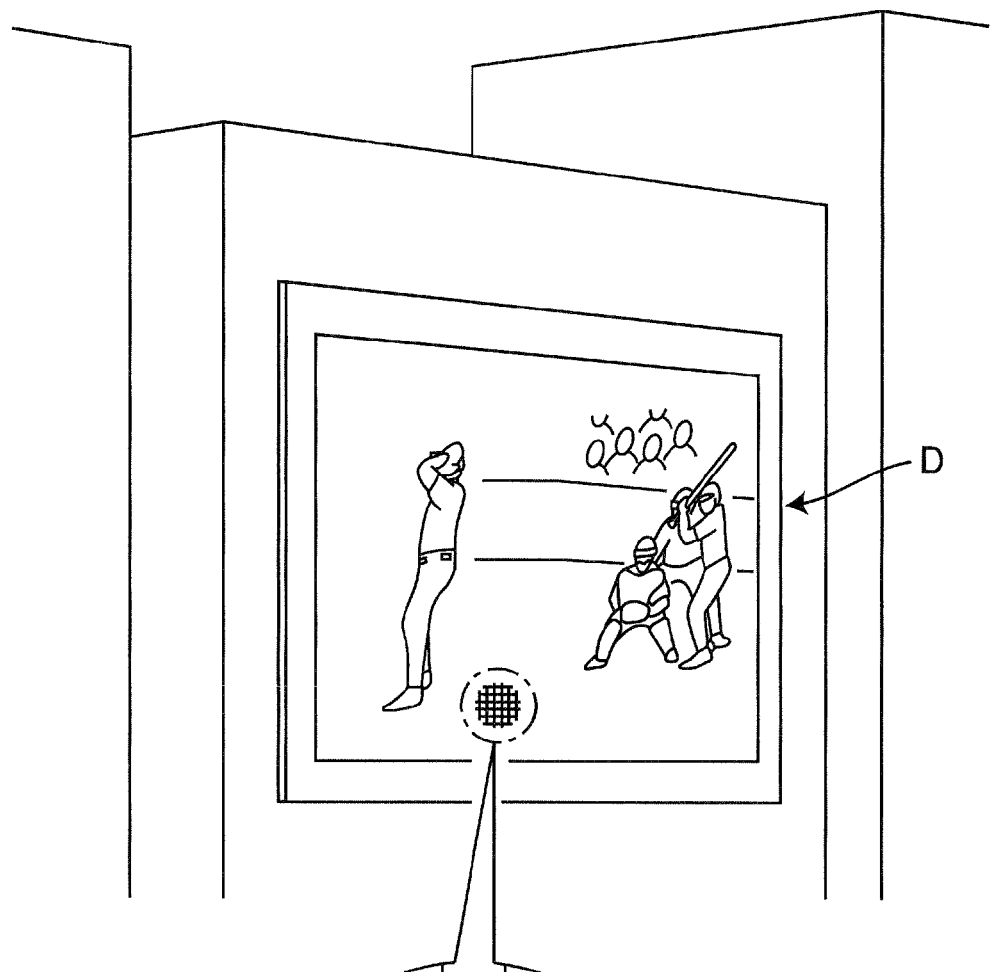
Figure 7B:
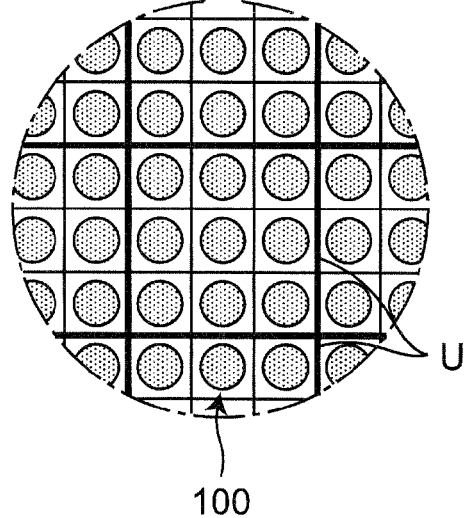
Figure 8:
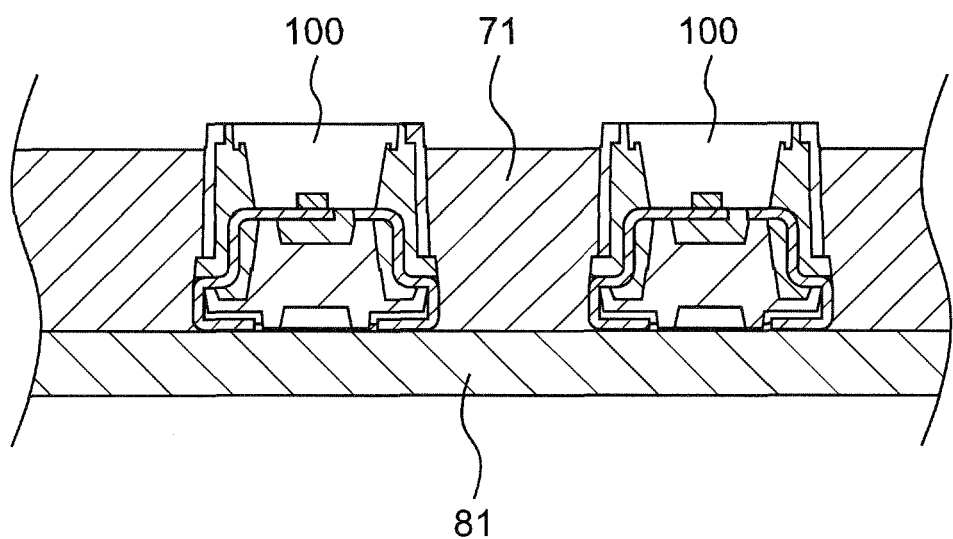
FIG. 8 is a schematic diagram showing an image displaying unit using light emitting devices according to one example of the present invention.

FIGS. 7A and 7B and FIG. 8 show image displaying units using the light emitting devices 100 according to the embodiments of the present invention. An image displaying unit includes a plurality of light emitting devices 100 and used for a large-size display installed outdoors or the like. The image displaying unit includes the light emitting devices 100, waterproofing resin 71, and a circuit board 81. The plurality of light emitting devices 100 are disposed on the circuit board, and the side surfaces of each light emitting device 100 are coated by the waterproofing resin 71.

The waterproofing resin is provided to prevent water such as rainwater or moisture in the outside air from entering into the light emitting devices. The waterproofing resin is formed by a silicone resin, for example, and is formed on the circuit board so as to cover the side surfaces of the light emitting devices mounted on the circuit board. It is preferable that the waterproofing resin is formed on the circuit board so as to cover the second side surface of each of the plurality of light emitting device packages and the projecting lead frames, and to cover a part of the first side surface of each package. Thus, water such as rainwater can be more surely prevented from entering into the light emitting device.

The circuit board electrically connects and mechanically retains the plurality of light emitting devices disposed thereon. The circuit board is formed in a quadrangular plate-like shape with a glass epoxy substrate on which a constant current driver circuit, a drive control circuit, a communication circuit, and the like, each not-shown, are mounted.

Hereinafter, examples of the present invention will be described with reference to the drawings.

FIRST EXAMPLE

FIG. 1 shows the light emitting device 100 according to the present example. The light emitting device 100 is obtained as follows.

Firstly, the lead frames 31 as conductive interconnections are obtained by subjecting a copper plate containing iron of a 0.15 mm thickness to punching and bending work and to silver-plating. Using the lead frames 31 and a white PPA resin containing $TiO_2$ for the second molded resin 21, the second molded resin is formed by injection molding.

In the light emitting device 100 according to the present example, in forming the second molded resin, the position of the lead frames exposed at the bottom surface of the opening is fixed by using a mold assembly having retaining pins. The light emitting device 100 according to the present example includes six lead frames, and six retaining pins which fix the lower surface side of the six lead frames exposed at the bottom surface of the opening of the package. Thus, the positional precision of the lead frames at the time of resin molding can be improved, and accordingly the positional precision of the die is also improved. That is, light distribution as the light emitting device can be stabilized, and hence mass-productivity can be improved. Further, gas contained in the resin is discharged along the surface of the mold assembly during molding of the resin, use of the mold assembly having the retaining pins in contact with the lead frames allows the molded resin to be surely packed. Thus, adhesion between the lead frames and the molded resin can be improved.

In the light emitting device 100 according to the present example, the second molded resin 21 forms the opening of the package. The opening is formed by the bottom surface and the inner wall surface that is continuous from the bottom surface to the upper surface of the package. The second molded resin forms the bottom surface and the inner wall surface of the opening. Further, the second molded resin is disposed to cover the upper surface (upper surface except for a portion exposed at the bottom surface of the opening) of the lead frames buried in the package, to form the second side surface above the lead frames projecting from the side surfaces of the package.

Next, by using a PPA resin containing carbon black as the first molded resin 11, the first molded resin is formed by injection molding. The first molded resin 11 is disposed to cover the second molded resin, while on the upper surface of the package, forming the first upper surface 11a around the second upper surface 21a which is at the periphery of the inner wall surface of the opening. Here, the second side surface is not covered by the first molded resin, and forms a part of the side surface of the package. At the portion having been in contact with the retaining pins during formation of the second molded resin, the first molded resin is disposed. The retaining pins retain the lower surface side of the lead frames exposed at the bottom surface of the opening of the package. Accordingly, although the first molded resin and the lower surfaces of the lead frames are disposed so as to be in contact with each other, the first molded resin will not be exposed at the bottom surface and the inner wall surface of the opening. The package formed in this manner is disposed such that the upper surfaces of the lead frames are disposed so as to be spaced apart from the interface between the first molded resin 11 and the second molded resin 21. Therefore, a highly reliable light emitting device can be provided.

The package according to the present example has a substantially rectangular parallelepiped shape, in which the upper surface measures 3.2 mm long and 3.2 mm wide. The height from the bottom surface to the upper surface at the end portion of the package is 2.7 mm.

Further, the opening 40 is provided substantially at the center of the upper surface of the package. The opening 40 has a shape of a quadrangle measuring 2.2 mm long and 2.4 mm wide, whose corners are rounded to have a radius of 0.85 mm. The depth from the upper surface of the package is 1.1 mm. The inner wall surface of the opening 40 is sloped to be widened from the bottom surface toward the upper surface by an angle of about 80 degrees. The second molded resin 21 is exposed by a width of 0.1 mm so as to surround the opening 40 at the upper surface of the package, and the first molded resin 11 is provided to surround the second molded resin 21.

At the inner wall surface of the opening 40, a step difference having a groove portion is provided. This step difference functions as an anchor, thereby preventing peeling from the sealing resin. The step difference is provided at the position away by 0.33 mm from the opening at the upper surface of the package, such that the planar shape of the groove portion assumes a substantially similar shape as the planar shape of the opening 40 at the upper surface of the package.

The lead frames are disposed so as to project outside from the side surfaces of the package. The second molded resin is disposed above the projecting lead frames, and the first molded resin is disposed above the second molded resin. The second molded resin disposed at the side surfaces is disposed to have a thickness of 0.25 mm above the projecting lead frames. Although the thickness is not particularly limited, considering that the side surfaces are covered by the water-proofing resin when the light emitting device is used for the image displaying unit, it is preferable that the projecting lead frames and the second molded resin are disposed to be half as high as the entire package or lower than that.

Next, to the lead frames that are exposed at the bottom surface of the opening 40 of the package, light emitting diodes being quadrangular light emitting elements 51 emitting light beams of wavelengths 470 nm, 530 nm, and 625 nm, respectively, are bonded to the lead frames on the negative electrode side using not-shown epoxy resin or silver paste. By wires 61, which are made of Au and have a diameter of 25 µm, the light emitting elements 51 are electrically connected to the positive and negative lead frames 31. The six lead frames are buried in the package so as to be partially exposed at the bottom surface of the package, with their respective end portions projected from the side surfaces of the package. As to the lead frames, one light emitting element is placed on one lead frame. These light emitting elements are respectively electrically connected to lead frames which are different from the lead frames on which the light emitting elements are placed. In this manner, by placing one light emitting element on one lead frame, the heat generated by the light emitting elements can be more efficiently dissipated to the outside by the lead frames.

Then, the epoxy resin as the sealing resin 41 is potted by 4.5 mg in the opening 40. Here, the potting is performed such that liquid epoxy resin is raised from the upper surface of the package. Thereafter, epoxy resin is heated for three hours at 100° C. and for four hours at 150° C., so as to be cured. The epoxy resin shrinks by thermal curing. Therefore, the epoxy resin is previously potted to be raised from the upper surface of the package, such that the epoxy resin and the upper surface become flush to each other after curing.

Finally, the end portions of the lead frames 31 (the lead frames disposed to externally project outside from the side surfaces of the package) are bent along the package.

In this manner, the light emitting device 100 according to the present example can be obtained.

SECOND EXAMPLE

Figure 5:
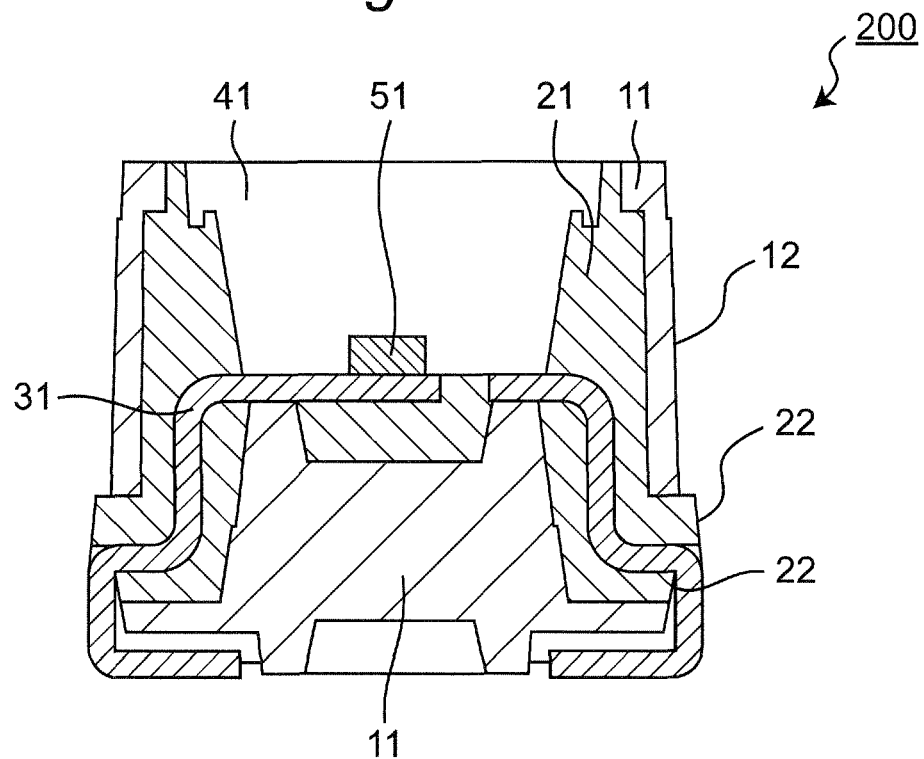
FIG. 5 is a cross-sectional view showing an exemplary light emitting device of the present invention.

A light emitting device 200 according to a second example is manufactured in the same manner as the first example except that the second side surface is disposed not only above the lead frames projecting from the side surfaces of the package as shown in FIG. 5 but also disposed below the lead frames. The effect of the present invention can also be achieved in this manner.

THIRD EXAMPLE

Figure 6:
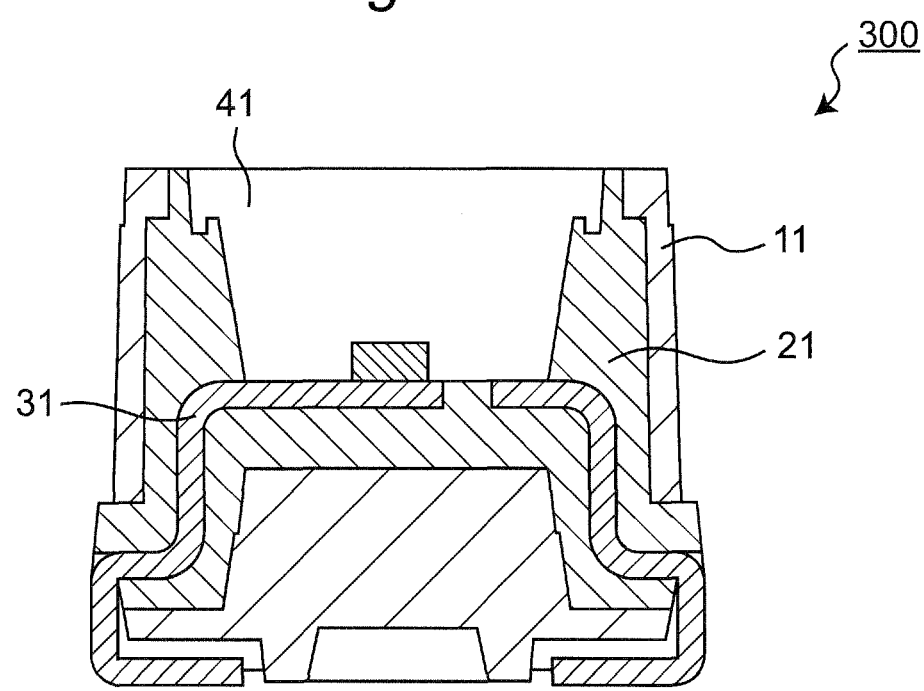
FIG. 6 is a cross-sectional view showing an exemplary light emitting device of the present invention.

In a light emitting device 300 according to a third example, as shown in FIG. 6, the lead frames in the package and the first molded resin 11 are not in contact with each other. Such a light emitting device 300 is manufactured in the same manner as the first example except that a mold assembly with no retaining pin is used as the mold assembly for forming the second molded resin. The effect of the present invention can also be achieved in this manner.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising: a package that has an opening at an upper surface side thereof; a lead frame that is buried in the package so as to be partially exposed at a bottom surface of the opening of the package, the lead frame having a portion forming a portion of a side surface of the light emitting device; and a light emitting element that is connected to a portion of an upper surface of the lead frame that is exposed at the bottom surface of the opening, wherein the package includes; a first molded resin that has a first upper surface that forms a part of the upper surface of the package, and a second molded resin that has (i) an inner wall surface that forms an inner wall surface of the opening of the package, and (ii) a second upper surface that forms a part of the upper surface of the package and that surrounds the opening at an inner side of the first upper surface; wherein the second molded resin is higher than the first molded resin in light reflectance to light emitted from the light emitting element, wherein a portion of the upper surface of the lead frame that is buried in the package is disposed so as to be spaced apart from an interface between the first molded resin and the second molded resin and wherein the side surface of the package includes a first side surface that is formed by the first molded resin and a second side surface that is formed by the second molded resin.

2. The light emitting device according to claim 1, wherein the second side surface is disposed below the first side surface and above at least the portion of the lead frame that forms the portion of the side surface of the light emitting device.

3. The light emitting device according to claim 2, wherein an outer peripheral surface of the second molded resin has, at a position higher than the bottom surface of the opening, a step difference that crosses a direction that is perpendicular to the upper surface of the package, and that bends an interface between the first molded resin and the second molded resin.

4. The light emitting device according to claim 3, wherein the step difference is formed along an entirety of the outer peripheral surface of the second molded resin.

5. The light emitting device according to claim 2, wherein the second side surface projects further outward than the first side surface.

6. The light emitting device according to claim 2, wherein the second side surface is disposed above and below a portion of the lead frame.

7. An image displaying unit comprising:
a circuit board on which a plurality of the light emitting devices according to claim 2, are disposed; and
waterproofing resin that is formed on the circuit board so as to cover the portion of the lead frame that forms a portion of the side surface of the light emitting device, the second side surface, and a part of the first side surface of each of the plurality of light emitting devices.

8. The light emitting device according to claim 1, wherein the light emitting device includes at least three of the light emitting elements, including a blue light emitting element, a green light emitting element, and a red light emitting element.

9. The light emitting device according to claim 8, wherein the light emitting device includes at least three of the lead frames, the blue light emitting element being mounted on a first lead frame, the green light emitting element being mounted on a second lead frame, and the red light emitting element being mounted on a third lead frame.

10. The light emitting device according to claim 1, wherein the lead frame is disposed so as to be spaced apart from the first molded resin.

11. An image displaying unit comprising:
a circuit board on which a plurality of the light emitting devices according to claim $i_s$ are disposed; and
waterproofing resin that is formed on the circuit board so as to cover the side surface of the package and the portion of the lead frame that forms a portion of the side surface of the light emitting device of each of the plurality of light emitting devices.

12. The light emitting device according to claim 1, wherein the second molded resin is further disposed at the bottom of the opening.

13. The light emitting device according to claim 1, wherein a portion of the lead frame that is buried in the package is bent.

14. The light emitting device according to claim 1, wherein the first molded resin comprises at least one of polyamide and polyphthalamide.

15. The light emitting device according to claim 1, wherein the second molded resin comprises at least one of polyamide and polyphthalamide.

16. The light emitting device according to claim 1, wherein a sealing resin is disposed in the opening of the package.

17. The light emitting device according to claim 16, wherein the sealing resin comprises an epoxy resin.

18. The light emitting device according to claim 16, wherein the sealing resin comprises a dispersing agent.

19. A light emitting device comprising: a package that has an opening at an upper surface side thereof; a lead frame that is buried in the package so as to be partially exposed at a bottom surface of the opening of the package, the lead frame having a portion forming a portion of a side surface of the light emitting device; and a light emitting element that is connected to a portion of an upper surface of the lead frame that is exposed at the bottom surface of the opening, wherein the package includes; a first molded resin that has a first upper surface that forms a part of the upper surface of the package, and a second molded resin that has (i) an inner wall surface that forms an inner wall surface of the opening of the package, and (ii) a second upper surface that forms a part of the upper surface of the package and that surrounds the opening at an inner side of the first upper surface; wherein the second molded resin is higher than the first molded resin in light reflectance to light emitted from the light emitting element, and wherein the side surface of the package includes a first side surface that is formed by the first molded resin and a second side surface that is formed by the second molded resin.

\* \* \* \* \*